United States Patent [19]

Terada et al.

[11] Patent Number: 4,958,317
[45] Date of Patent: Sep. 18, 1990

[54] NONVOLATILE SEMICONDUCTOR MEMORY DEVICE AND A WRITING METHOD USING ELECTRON TUNNELING

[75] Inventors: Yasushi Terada; Kazuo Kobayashi; Takeshi Nakayama, all of Hyogo, Japan

[73] Assignee: Mitsubishi Denki Kabushiki Kaisha, Tokyo, Japan

[21] Appl. No.: 224,743

[22] Filed: Jul. 27, 1988

[30] Foreign Application Priority Data

Jul. 27, 1987 [JP] Japan ................... 62-187962

[51] Int. Cl.⁵ .................. G11C 7/00; G11C 16/02
[52] U.S. Cl. .................. 365/104; 365/185; 365/189.04; 365/189.05
[58] Field of Search .............. 365/189.05, 185, 94, 365/103, 104, 189.11, 189.01

[56] References Cited

U.S. PATENT DOCUMENTS

| | | | |
|---|---|---|---|
| 4,630,087 | 12/1986 | Momodomi | 365/185 X |
| 4,649,521 | 3/1987 | Tsuchida et al. | 365/185 |
| 4,667,312 | 5/1987 | Doung et al. | 365/203 X |
| 4,723,225 | 2/1988 | Kaszubinski et al. | 365/185 |
| 4,811,292 | 3/1989 | Watanabe | 365/204 X |

OTHER PUBLICATIONS

Suciu, et al., A 64K EEPROM with extended Temperature and Page Mode Operation, 1985 IEEE International Solid-State Circuits Conference, pp. 170–171, 336.

Hu, A 128K Flash EEPROM Using Double Polysilicon Technology, 1987 IEEE International Solid-State Circuits Conference, pp. 76–77, 345.

Primary Examiner—Stuart N. Hecker
Assistant Examiner—Alyssa H. Bowler
Attorney, Agent, or Firm—Lowe, Price, Leblanc, Becker & Shur

[57] ABSTRACT

Externally inputted data of one word line is temporarily stored in a latch circuit. In the writing cycle, the data stored and held in the latch circuit is collectively written in memory transistors connected to the selected word line. On this occasion, 0 V is applied to one of the control gate and the drain of the memory transistor in which "0" is written and a high voltage $V_{PP}$ is applied to the other of the control gate and the drain. Therefore, not only in the erasing cycle but also in the writing cycle, the operation is carried out by the movement of charges caused by the electron tunneling.

10 Claims, 13 Drawing Sheets

NONVOLATILE SEMICONDUCTOR MEMORY DEVICE AND A WRITING METHOD USING ELECTRON TUNNELING

BACKGROUND OF THE INVENTION

1. Field of the Invention

The present invention relates generally to a nonvolatile semiconductor memory device and a writing method therefor, and more particularly to a nonvolatile semiconductor memory device capable of electrically rewriting information and a writing method therefor.

2. Description of the Prior Art

FIG. 1 is a circuit diagram showing a portion of a memory cell array of a conventional nonvolatile semiconductor memory device (EEPROM) disclosed in "A 128K Flash EEPROM using Double Polysilicon Technology", ISSCC Digest of Technical Papers, pp. 76–77, 1987. In FIG. 1, voltages for writing and erasing each of the memory transistors are also disclosed.

Referring to the figure, memory transistors Q1 to Q4 are MOS transistors each provided with a floating gate, and each forming one memory cell. The memory transistors are arranged in a matrix and the respective source electrodes thereof connected with a source line SL common to all the cells. A bit line connects the drain electrodes of the memory transistors in the same column (in FIG. 1, two bit lines BL1 and BL2 are shown). A word line connects the control gates of the memory transistors in the same row (in FIG. 1, two word lines WL1 and WL2 are shown). Although FIG. 1 shows four memory transistors as representatives, a memory cell array usually comprises a larger number of memory transistors.

FIG. 2 shows a cross-sectional structure of the memory transistors Q1 to Q4 shown in FIG. 1. Referring to FIG. 2, a drain diffused region 2 and a source diffused region 3 are formed spaced apart from each other by a prescribed distance on a surface of a semiconductor substrate 1. The semiconductor substrate 1 is covered with a thin oxide film 4 of about 200 Å in thickness. A floating gate 5 is provided on the oxide film such that a portion of the floating gate 5 is opposed to an end portion of the drain diffused region 2. The floating gate 5 and the oxide film 4 are covered with an oxide film 6 and the oxide 6 is further covered by a control gate 7. Therefore, the control gate has a low step at the portion where the floating gate 5 does not exist. The floating gate 5 is in an electrically floating state surrounded by the oxide films 4 and 6. A drain electrode 8, a control gate electrode 9 and a source electrode 10 are respectively connected to the drain diffused region 2, the control gate 7 and the source diffused region 3.

The writing operation of the above described conventional device will be described in the following.

First, an erasing cycle is carried out in which "1" is written in all the memory transistors. The erasing cycle is completed by applying a high voltage $V_{PP}$ to all the bit lines (BL1 and BL2 in FIG. 1) and by applying "L" level (0 V) to all the word lines (WL1 and WL2 in FIG. 1). By doing so, a high electric field is generated between the floating gate 5 and the drain diffused region 2 of all the memory transistors (Q1 to Q4 in FIG. 1). Therefore, electrons stored in the floating gate 5 are drawn into the drain diffused region 2 through the thin oxide film 4 by electron tunneling. Consequently, the floating gate 5 is depleted of electrons and accordingly a threshold voltage of each of the memory transistors Q1 to Q4 viewed from the control gate 7 is lowered (becomes negative level). A logic "1" is assigned to that state.

When the erasing cycle is finished, a writing cycle begins. The writing cycle is carried out in the similar manner as the program opertion in an EPROM. More specifically, a high voltage $V_{PP}$ is applied to a selected bit line (BL2 in FIG. 1) while 0 V is applied to the non-selected bit line (BL1 in FIG. 1). A high voltage $V_{PP}$ is applied to the selected word line (WL1 in FIG. 1) while 0 V is applied to the non-selected word line (WL2 in FIG. 1). Consequently, a high voltage $V_{PP}$ is applied to the drain diffused region 2 and to the control gate 7 of the selected memory transistor (Q3 in FIG. 1). At this time, hot electrons are generated in the vicinity of the drain diffused region 2 of the selected memory transistor Q3, and the hot electrons are accelerated by the high voltage $V_{PP}$ applied to the control gate 7 so as to be introduced into the floating gate 5. As a result, electrons are stored in the floating gate 5, and a threshold voltage of the memory transistor Q3 viewed from the control gate 7 becomes higher (becomes positive level). Thus, a logic "0" is written in the selected memory cell. Meanwhile, the source line SL is always set at "L" level.

In the above described EEPROM having 1 transistor.1 memory cell structure, it is not necessary to erase stored information using ultraviolet rays as required in an EPROM and the information can be electrically erased, thereby enabling simple rewriting operation. In addition, one memory cell can be formed by a single transistor, not by two transistors as in an EEPROM, and thus, chip area can be reduced.

A conventional EEPROM having 1 transistor.1 memory cell structure is structured as described above, and writing of the logic "0" into the selected memory transistor is carried out by introducing hot electrons. However, if the high voltage $V_{PP}$ is obtained by internally boosting an output voltage $V_{CC}$ from the external power supply, the current driving capacity is small, so that sufficient hot electrons can not be introduced. Therefore, there was a disadvantage that a power supply capable of generating a high voltage $V_{PP}$ is required as an external power supply, and a single power supply having $V_{CC}$ level is not sufficient for carrying out the operation.

In addition, if the writing is done by introducing hot electrons, a number of excessive electrons are generated in the thin oxide film 4, causing degradation of the said oxide film 4. Therefore, there was a disadvantage that the number of reliable rewriting is relatively small (about 1000 times).

Furthermore, since the writing is carried out in the memory transistors one by one, several milliseconds are required for writing 1 byte, so that the writing of the whole chip takes a long period of time.

SUMMARY OF THE INVENTION

An object of the present invention is to operate a nonvolatile semiconductor memory device by a single power supply without externally introducing a high voltage.

Another object of the present invention is to effect writing and erasing into and from each of the memory transistors constituting a memory cell array only by movement of charges caused by electron tunnelling.

A further object of the present invention is to enable fast rewriting of data in a nonvolatile semiconductor memory device.

A still further object of the present invention is to effect rewriting of data in a nonvolatile semiconductor memory simultaneously for every word line by word line in the memory cell array.

Briefly stated, in the present invention, each of the memory cells in the memory cell array is formed by one memory transistor having a floating gate, a word line is connected to respective control gate electrodes of the memory transistors in the same row, and a bit line is connected to respective drain electrodes of the memory transistors in the same column. In writing data in the nonvolatile semiconductor memory device comprising such memory cell array, a data at least for one word line is stored to be written into the memory transistor, and the ground voltage, a high voltage and intermediate voltage are applied to word lines and bit lines such that the electron tunneling is generated only in that memory transistor which is specified by externally applied address signal and by the content of the stored data, whereby the said stored data is collectively written in the memory transistor.

According to the present invention, the writing into each of the memory transistors is effected by the movement of charges due to the electron tunneling instead of the conventional introduction of hot electrons, so that it is not necessary to provide a power supply having a large current driving capacity in writing data. Therefore, a high voltage for writing can be obtained by internally boosting the voltage applied from an external single power supply, so that the nonvolatile semiconductor memory device can be operated by a single power supply. Consequently, the structure of the power supply can be made simple, and the costs for the whole system can be reduced. Compared with the conventional writing by introducing hot electrons, the degradation of the memory transistor can be suppressed and the number of rewritings can be greatly increased. In addition, when the data is written in each of the memory transistors, the data for one word line is stored and the stored data is simultaneously written in each of the memory transistors connected to the selected word line. Thererfore, compared with the conventional device, in which writing is carried out for every memory cell, the time required for writing data can be greatly reduced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

First, referring to FIG. 3, the structure of a memory cell array of an EEPROM which is a first embodiment of the present invention and the voltages to be applied to the gate and the drain of each memory transistor will be described.

Figure 1:
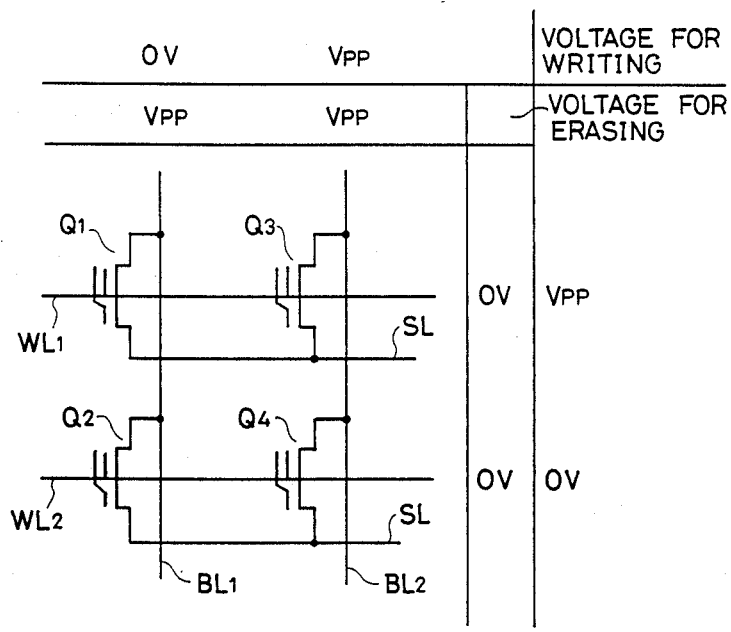
FIG.1 shows a circuit structure of one portion of a memory cell array in a conventional nonvolatile semiconductor memory device together with voltages for writing and erasing applied to each of the memory transistors.

In the figure, the bit lines $BL_1$ and $BL_2$, word lines $WL_1$ and $WL_2$ and the source lines $SL_1$ and $SL_2$ are the same as the prior art (FIG. 1). However, the structure of the memory transistors Q1 to Q4 is different.

Figure 3:
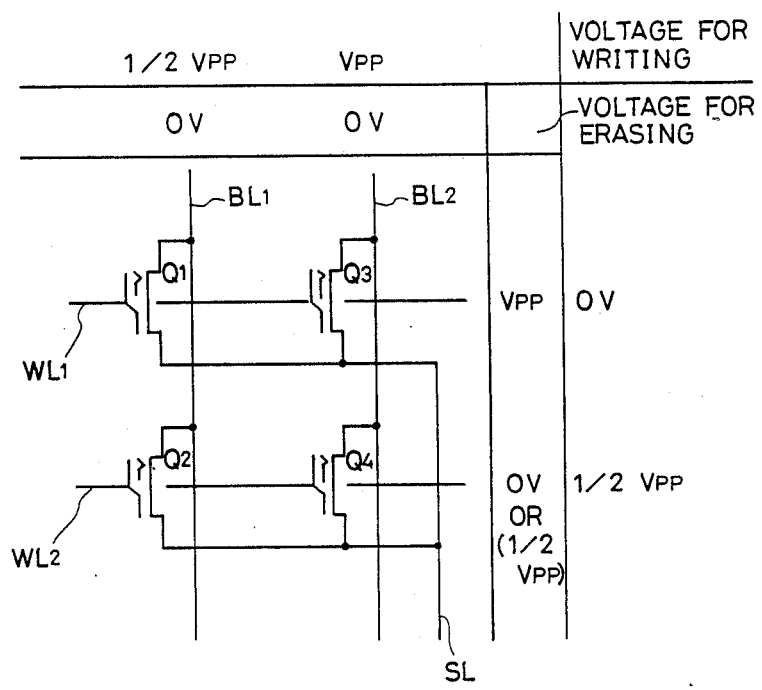
FIG. 3 shows voltages for writing and erasing applied to each of the memory transistors in a first embodiment of the present invention.
Figure 4:
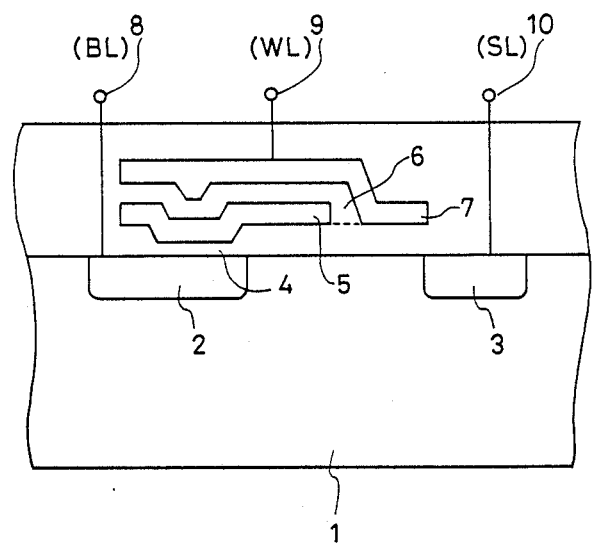
FIG. 4 shows a cross sectional structure of the memory transistors in FIG. 3.

Referring to FIG. 4, the cross sectional structure of the memory transistors Q1 to Q4 shown in FIG. 3 will be described. Different from the memory transistor shown in FIG. 2, the floating gate 5 is formed to have a concave portion and extending in the right and left directions. The thickness of an oxide film 4 below the concave portion of the floating gate 5 is about 100 Å, which is the same as in a conventional EEPROM. A control gate 7 is formed such that it corresponds to the concave shape of the floating gate 5 as in the conventional EEPROM at the poriton above the floating gate 5, and, as to other portions, they are formed with steps so that they have approximately the same height as the floating gate 5. By structuring the control gate 7 in this manner, an enhancement type memory transistor is provided. Similar to the device shown in FIG. 2, a drain electrode 8, a control gate electrode 9 and a source electrode 10 are respectively connected to the bit line BL, word line WL and the source line SL.

In this structure, the erasing cycle (the cycle to write "1") of the memory transistors Q1 and Q3 connected to the word line $WL_1$ will be effected in the following manner. Namely, the voltage levels of the bit lines $BL_1$, $BL_2$ and word lines $WL_1$, $WL_2$ are set at "0" (0 V), "L", $V_{PP}$, and "L", respectively. Consequently, electrons are introduced to the floating gate 5 from the drains 2 of the memory transistors Q1 and Q3 by the electron tunneling, whereby the threshold voltage is raised to a positive level. In the embodiment, "1" is assigned to this state, although it is contrary to the prior art (FIG. 1).

The writing cycle, in which "1" and "0" are respectively written in the memory transistors Q1 and Q3 connected to the selected word line $WL_1$, for example, is effected in the following manner. Namely, the potential levels of the bit lines $BL_1$, $BL_2$ and word lines $WL_1$ and $WL_2$ are respectively set at $\frac{1}{2} V_{PP}$, $V_{PP}$, "L" and $\frac{1}{2} V_{PP}$. By doing so, a high electric field is generated between the floating gate 5 and the drain 2 of the memory transistor Q3, whereby electrons are discharged from the floating gate 5 to the drain 2 by electron tunneling. Therefore, the threshold voltage of the memory transistor Q3 is lowered to a negative level. In this embodiment, "0" is assigned to this state.

As to the memory transistor Q1 in which "1" is written in the above described erasing cycle and to nonselective memory transistors Q2 and Q4, no electric field so high as to induce electron tunneling is generated between the floating gate 5 and the drain 2 of each of the transistors, since the potential difference between the drain and the control gate of these transistors are respectively $\frac{1}{2} V_{PP}$, 0 V and $\frac{1}{2} V_{PP}$. Therefore, the threshold voltage, (that is, the stored content of the data) remains as it is. The potential of the source line SL is kept at a floating state in erasing and writing.

In the above described embodiment, the electron tunneling is utilized both in the erasing and writing cycles. Therefore, no such high voltage power supply having a large current driving capacity as required in writing effected by introducing hot electrons is required in this embodiment, and a high voltage $V_{PP}$ which is obtained by internally boosting a normal power supply voltage $V_{CC}$ is sufficient for the erasing and writing cycles. In addition, since the writing is carried out not by introducing hot electrons but merely by the electron tunneling, the number of reliable writing is improved to 10~100 times as large as that in the conventional device of FIG. 1.

Figure 5:
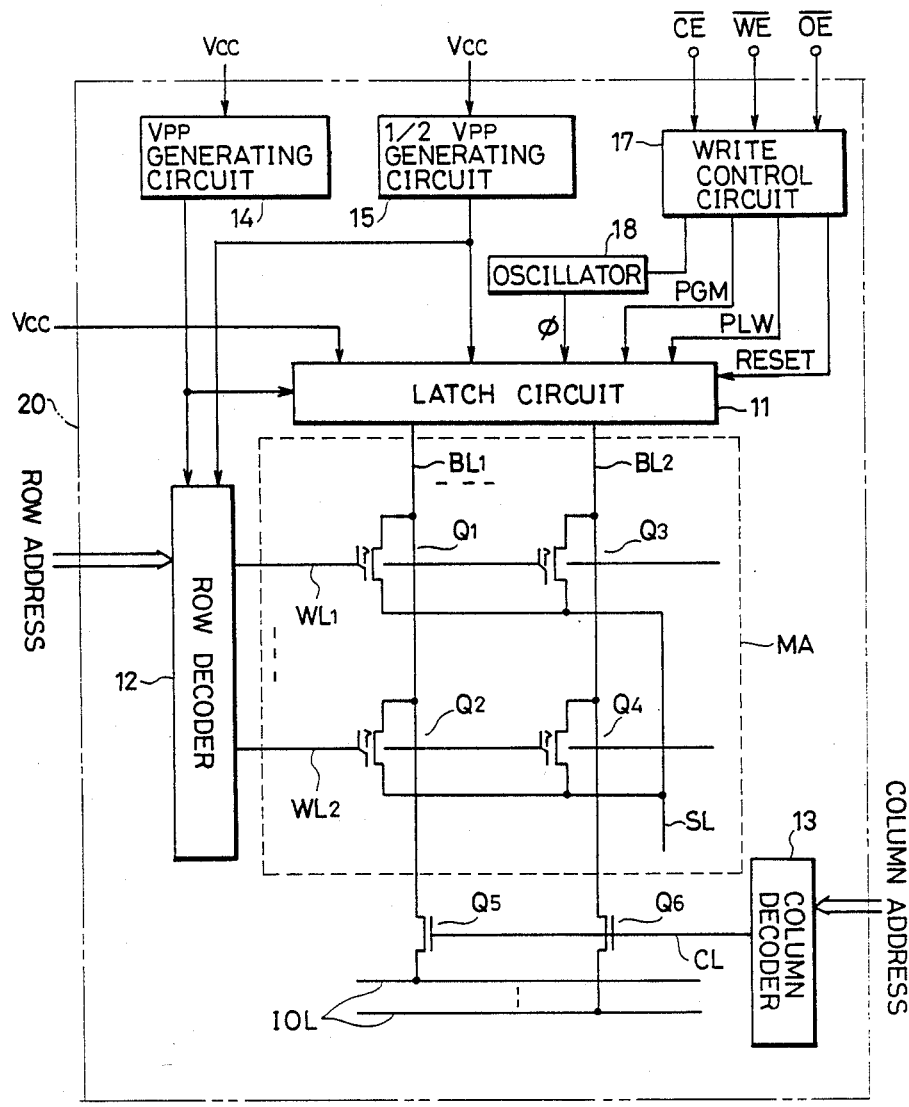
FIG. 5 is a block diagram showing the whole structure of the nonvolatile semiconductor memory device in accordance with the first embodiment of the present invention.

The whole structure of the EEPROM in accordance with the first embodiment of the present invention will be described with reference to FIG. 5. The EEPROM shown in FIG. 5 is preferably arranged on one semiconductor chip 20. In the figure, the memory cell array MA has the same structure as that shown in FIG. 3. A latch circuit 11 is connected to one end of the bit lines $BL_1$ and $BL_2$ and a row decoder 12 is connected to one end of the word lines $WL_1$ and $WL_2$. The other end of each of the bit lines $BL_1$ and $BL_2$ is connected to an I/O line IOL through transistors Q5 and Q6, respectively, with the gates of these transistors Q5 and Q6 connected to a column signal line CL of the column decoder 13.

An output voltage $V_{PP}$ of a $V_{PP}$ generating circuit 14 and an output voltage $\frac{1}{2} V_{PP}$ of a $\frac{1}{2} V_{PP}$ generating circuit 15 are applied to the above described latch circuit 11 and the row decoder 12, respectively. The $V_{PP}$ generating circuit 14 and the $\frac{1}{2} V_{PP}$ generating circuit 15 generate a high voltage $V_{PP}$ and an intermediate voltage $\frac{1}{2} V_{PP}$ (which in an intermediate voltage between the ground voltage 0 V and the high voltage $V_{PP}$, and $\frac{1}{2} V_{PP} > V_{CC}$), respectively, by internally boosting the voltage $V_{CC}$ applied from an external power supply (not shown). A write control circuit 17 generates various internal control signals based on externally applied chip enable signal $\overline{CE}$, write enable signal $\overline{WE}$ and an output enable signal $\overline{OE}$. The write control circuit 17 generates signals PGM, PLW and RESET which are internal control signals of interest to the present embodiment, to apply the same to the latch circuit 11. In addition, the write control circuit 17 applies a control signal to an oscillating circuit 18 to control the activation/inactivation thereof. The oscillating circuit 18 generates a clock pulse $\phi$ when it is activated, and applies the same to the latch circuit 11.

Figure 6:
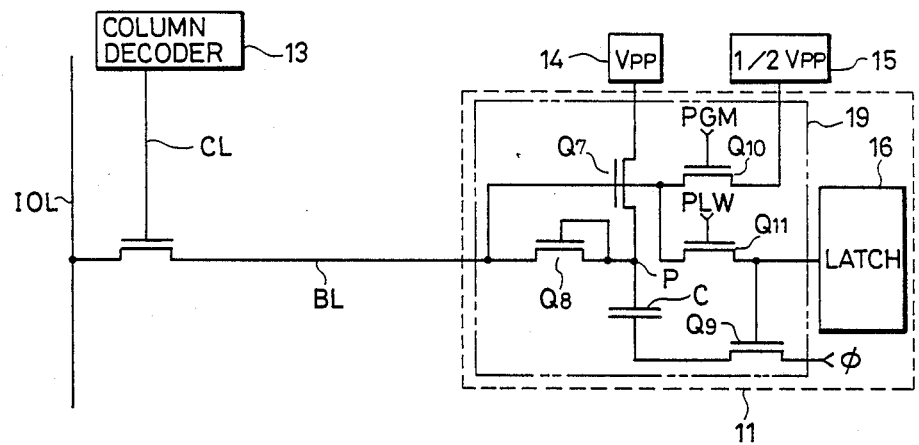
FIG. 6 is a circuit diagram showing in detail the portion corresponding to one bit line in a latch circuit 11 shown in FIG. 5.

FIG. 6 is a circuit diagram showing in detail the portion corresponding to one bit line of the latch circuit 11 shown in FIG. 5. As is shown in the figure, the latch circuit 11 comprises a bootstrap circuit 19 comprising transistors Q7~Q11 and a capacitor C, and a latch 16. An output of the $V_{PP}$ generating circuit 14 is applied to the drain of the transistor Q7. The transistor Q7 has its gate connected to the bit line BL, and its source connected to the drain and the gate of the transistor Q8 and to one electrode of the capacitor C. The other electrode of the capacitor C is connected to the drain of the transistor Q9. The source of the transistor Q8 is connected to the bit line BL.

Meanwhile, an output of the $\frac{1}{2} V_{PP}$ generating circuit 15 is connected to the drain of the transistor Q10. A signal PGM is applied to the gate of the transistor Q10. The transistor Q10 has its source connected to the bit line BL and to the drain of the transistor Q11. A signal PLW is applied to the gate of the transistor Q11. The source of the transistor Q11 is connected to the latch 16 and to the gate of the transistor Q9. A clock pulse $\phi$ is applied to the source of the transistor Q9.

Figure 7A:
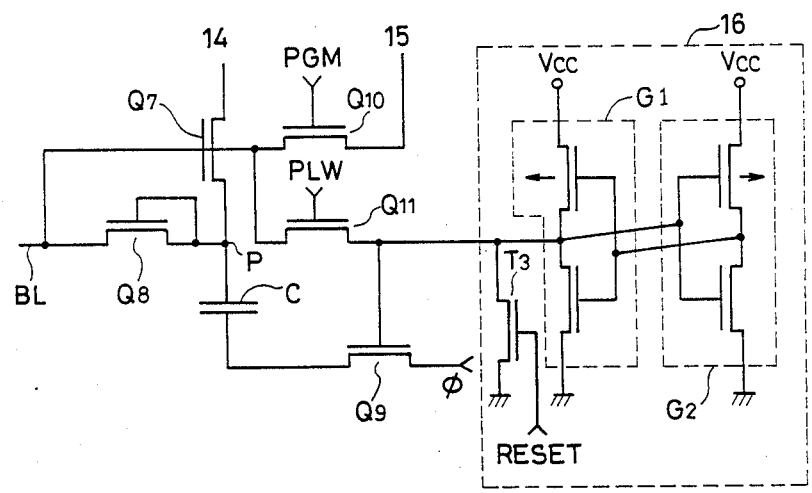
FIGS. 7A and 7B are schematic diagrams showing examples of the circuit structures of the latch 16 shown in FIG. 6.
Figure 7B:
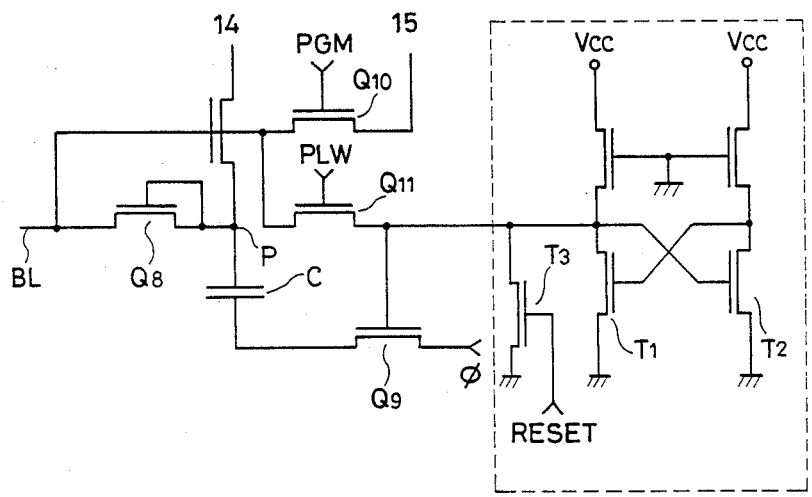

FIG. 7A is a circuit diagram showing one example of the structure of the latch 16 shown in FIG. 6. In FIG. 7A, the latch is formed by inverters G1 and G2 of C-MOS structure. FIG. 7B is a circuit diagram showing another example of the structure of the latch 16 shown in FIG. 6. In FIG. 7B, the latch is formed by a flip flop structure of transistors $T_1$ and $T_2$. In both structures shown in FIGS. 7A and 7B, the stored data can be forced to the "L" level by applying a reset signal RESET to the gate of the transistor $T_3$.

In such structure, by setting the signals PGM and PLW at "L" and "H" level, respectively, the voltage level of the bit line BL can be held at the latch 16 through the transistor Q11. This is what is called the latch operation.

The bit line BL can be brought to the ground level by setting both signals PGM and PLW at the "L" level, setting the output of the column decoder 13 at the "H" level and by setting the I/O line IOL at the ground level. Meanwhile, the bit line BL can be brought to be the ground level alternatively by setting the signal PGM and PLW at the "L" level, setting the output of the column decoder 13 at the "L" level and conducting switching transistor and the like provided between the bit line BL and the ground level. This is the grounding operation.

In addition, the bootstrap circuit 19 is controlled by a voltage level held in the latch 16 by setting the signals PGM and PLW at $\frac{1}{2} V_{PP}$ and "L" level, respectively, and by setting the output of the column decoder 13 at the "L" level, whereby the voltage on the bit line BL can be set at $\frac{1}{2} V_{PP}$ level or at $V_{PP}$ level. The details will be described in the following.

If the data held in the latch 16 is at the "L" level, the transistor Q9 does not conduct, and only the output of the $\frac{1}{2} V_{PP}$ generating circuit 15 is transmitted to the bit line BL through the transistor Q10, so that the voltage level of the bit line BL becomes $\frac{1}{2} V_{PP}$.

Meanwhile, if the data held in the latch 16 is at the "H" level, the transistor Q9 becomes conductive, and the potential at an node P (about $\frac{1}{2}$ $V_{PP}$ level at the initial state) is increased by the capacitance coupling of the capacitor C when the clock pulse $\phi$ rises. Consequently, the transistor Q8 becomes conductive and the voltage applied to the gate of the transistor Q7 is increased to be higher than $\frac{1}{2}$ $V_{PP}$ level, whereby a current is supplied to the node P through the transistor Q7. Thereafter, the clock pulse $\phi$ falls and the transistor Q7 and Q8 become non-conductive. Therefore, the node P is brought to the floating state. However, on this occasion the voltage at the node P is higher than $\frac{1}{2}$ $V_{PP}$ level and the voltage is maintaned until the clock pulse $\phi$ rises again. By repeatedly applying the clock pulse $\phi$, the voltage level of the node P, that is, the voltage level of the bit line BL can be made approximately equal to $V_{PP}$ which is the ouput voltage of the $V_{PP}$ generating circuit 14. The above described operation is the latch data boosting operation..

Figure 8:
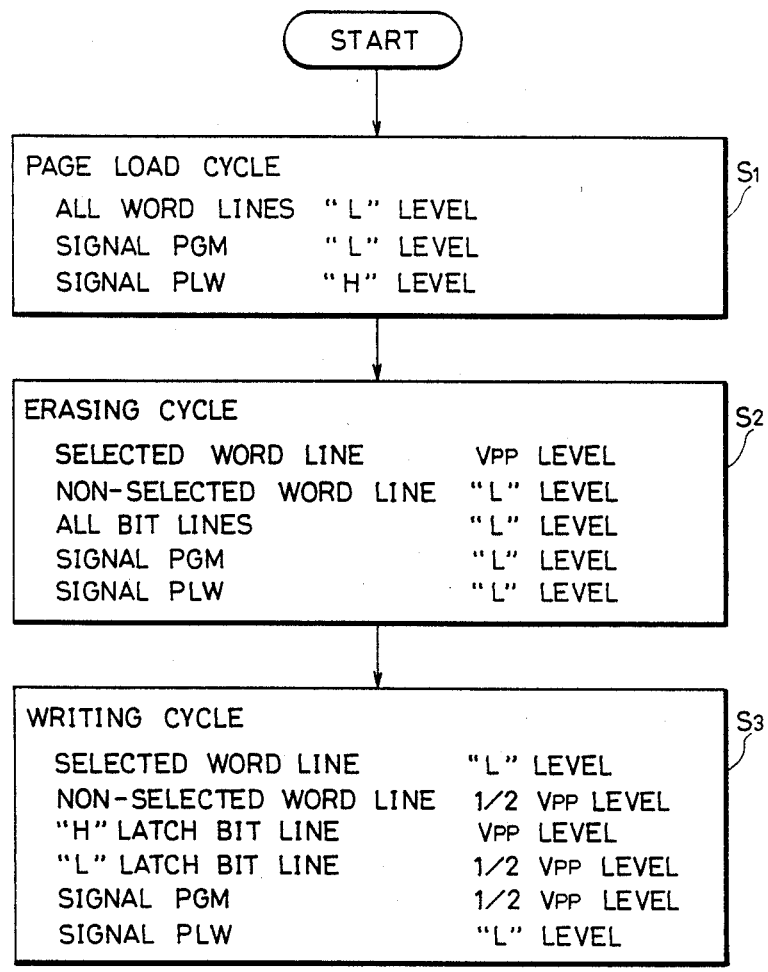
FIGS. 8 and 9 are flow charts for explaining the operation of the embodiment shown in FIGS. 3 to 6.

FIG. 8 is a flow chart showing the writing operation of the above described EEPROM. The operation will be described with reference to the figure. First, in the step S1, all word lines WL are set at "L" level by the row decoder 12 and a set of bit lines is selected by a column decoder 13 corresponding to the column address, and the said bit lines are connected to the I/O line IOL. The signals PGM and PLW of the latch circuit 11 which is connected to the selected set of bit lines BL are set at "L" and "H" level, respectively. By doing so, the data on the I/O line IOL is held in the latch 11 through the said selected set of bit lines BL. The level of the I/O line IOL is the inverted level of the input data, that is, the input data is "1", the level of the line is "L" and if the data is "0", the line level will be "H" level. By repeating these series of operation for a plurailty of times on all of the bit lines BL, the data which should be rewritten in all of the memory transistors connected to one word line WL which will be selected in the next step S2 is held in the latch circuit 11. The foregoing is the page load cycle.

Thereafter, in the step S2, one word line WL selected by the row decoder 12 corresponding to the row address is set at $V_{PP}$ level, the non-selected word line WL is set at "L" level, and the signals PGM and PLW are set at "L" level. All the bit lines BL are set at "L" level by the above described grounding operation. Therefore, electrons are introduced to the floating gates 5 of all the memory tranistors connected to the selected one word line WL by the electron tunneling, whereby the threshold voltages of all the memory transistors become positive level ("1" is written). The foregoing is the erasing cycle. $\frac{1}{2}$ $V_{PP}$ may be applied to the non-selected word line WL.

In the step S3, the one word line WL selected by the row decoder 12 is set at "L" level and the non-selected word line WL is set at $\frac{1}{2}$ $V_{PP}$ level, and the signals PGM and PLW are set at $\frac{1}{2}$ $V_{PP}$ and "L" level, respectively. Consequently, the latch circuit 11 carries out the above described latch data boosting operation. Therefore, the data of "H" level (input data is "0") and the data of the "L" level (input data is "1") filled in the latch 16 are converted into a high voltage $V_{PP}$ and an intermediate voltage $\frac{1}{2}$ $V_{PP}$, respectively, to be applied to the bit line BL. Consequently, the threshold voltage of the memory transistor connected to the bit line BL to which the intermediate voltage $\frac{1}{2}$ $V_{PP}$ is supplied remains at the positive level ("1" is written), and the threshold voltage of the memory transistor connected to the bit line BL to which the high voltage $V_{PP}$ is applied becomes negative level ("0" is written), since electrons are extracted from the floating gate 5 by the electron tunneling. The foregoing is the writing cycle.

In this manner, the data held by the latch circuit 11 can be written collectively to all of the memory transistors connected to the selected one word line WL, whereby the time required for writing can be reduced. The above described series of operations (S1 to S3) is repeated for each word line and writing is carried out in all of the memory transistors in the memory cell array MA.

Figure 9:
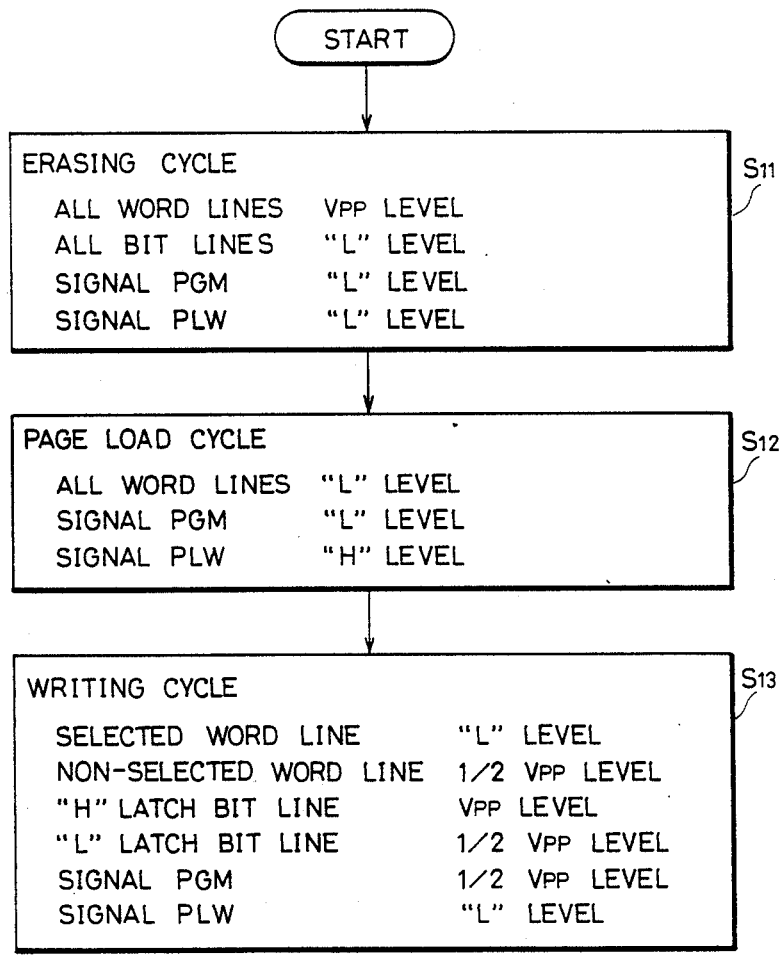

FIG. 9 is a flow chart showing another writing operation. In this flow chart, the erasing cycle is done in the step S11, wherein the memory transistors are collectively erased ("1" is written) by applying high voltage $V_{PP}$ to all word lines WL and by setting all bit lines BL at "L" level.

The above described page load cycle and the above described writing cycle are respectively executed in steps S12 and S13, respectively, whereby the data is written in all the memory transistors connected to the selected one word line WL. In order to effect writing for all memory transistors, the steps S12 and S13 should be repeated as many time as the number of the word lines WL.

A second embodiment of the present invention will be described with reference to FIGS. 10 to 12.

Figure 10:
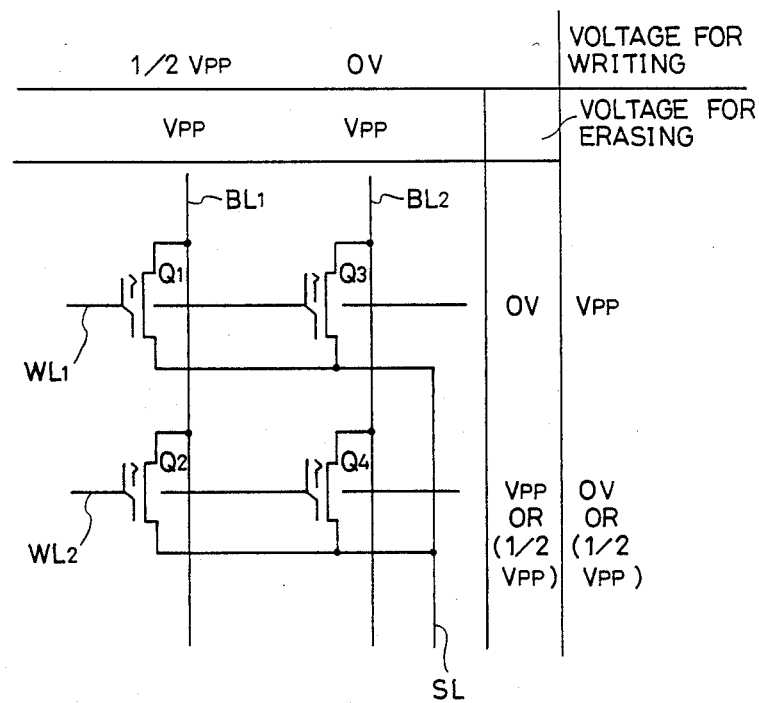
FIG. 10 shows voltages for writing and erasing applied to each of the memory transistors in a second emobodiment of the present invention.

As shown in FIG. 10, the structure of the memory cell array is the same as that of the first embodiment shown in FIG. 3. What is different is the voltage applied to each of the word lines and bit lines in the erasing cycle and in the writing cycle. Namely, in the erasing cycle, the high voltage $V_{PP}$ is applied to all bit lines, 0 V is applied to the selected word line $WL_1$ and the high voltage $V_{PP}$ (or the intermediate voltage $\frac{1}{2}$ $V_{PP}$) is applied to the non-selected word line $WL_2$, respectively. Consequently, electrons are discharged from the floating gates 5 of the memory transistors $Q_1$ and $Q_3$ connected to the selected word line $WL_1$ to the drain 2 by the electron tunneling, whereby "1" is written. In the memory transistors Q2 and Q4, there is no high electric field generated between the floating gate 5 and the drain 2, so that the initial state maintained. Thereafter, in the writing cycle in which the word line $WL_1$ is selected and "1" and "0" are to be written in the transistors Q1 and Q3 which are connected to the word line $WL_1$, respectively, for example, intermediate voltage $\frac{1}{2}$ $V_{PP}$ and 0 V are respectively applied to the bit lines $BL_1$ and $BL_2$, and the high voltage $V_{PP}$ and 0 V (or the intermediate voltage $\frac{1}{2}$ $V_{PP}$) are respectively applied to the selected word line $WL_1$ and to the non-selected word line $WL_2$. By doing so, a high electric field is generated between the floating gate 5 and the drain 2 of the memory transistor Q3 and electrons are introduced from the drain 2 to the floating gate 5 by the electron tunneling. Consequently, the threshold voltage of the memory transistor Q3 is lowered to the negative level, and "0" is written. Therefore, "1" is assigned to the state in which electrons are discharged from the floating gate of the memory transistor and "0" is assigned to the state in which electrons are introduced to the floating gate 5 in the second embodiment, as is the same as the prior art shown in FIG. 1.

Figure 11:
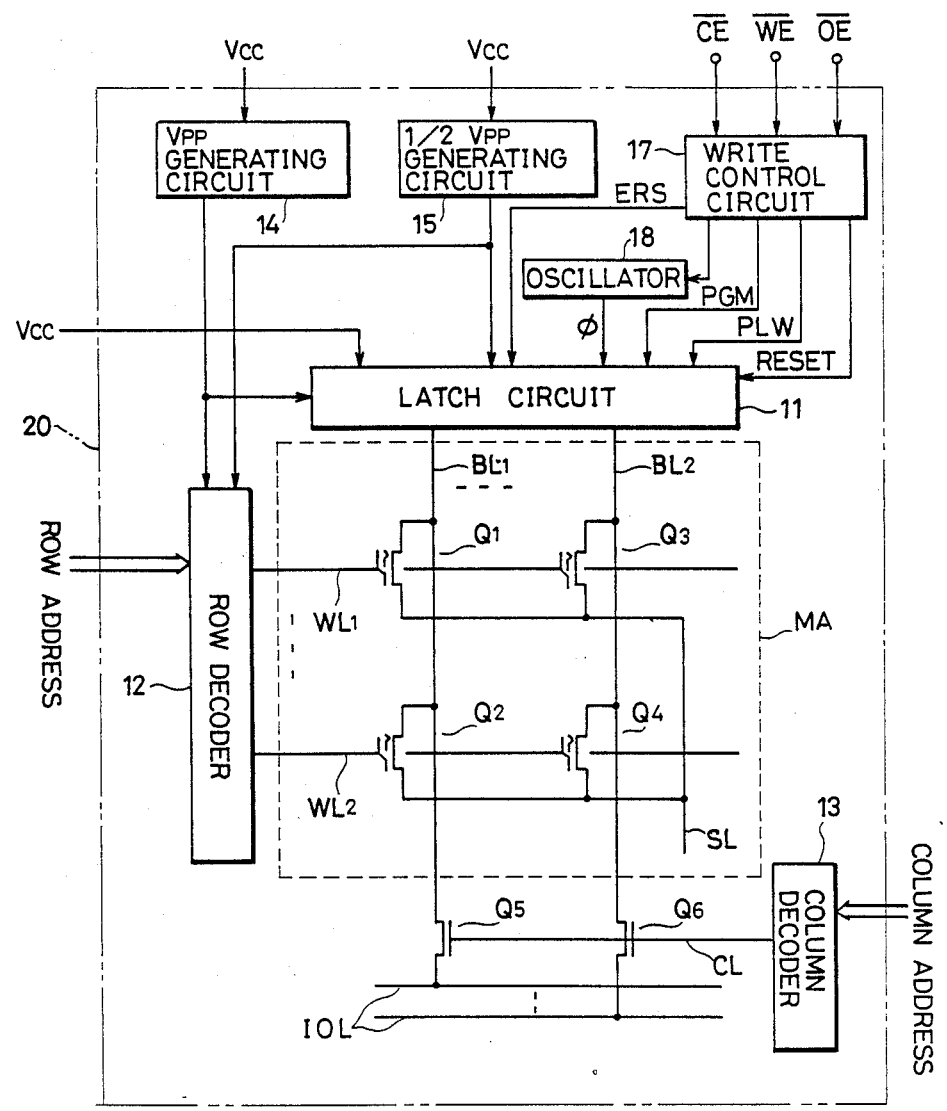
FIG. 11 is a block diagram showing the whole structure of a nonvolatile semiconductor memory device in accordance with the second embodiment of the present invention.
Figure 12:
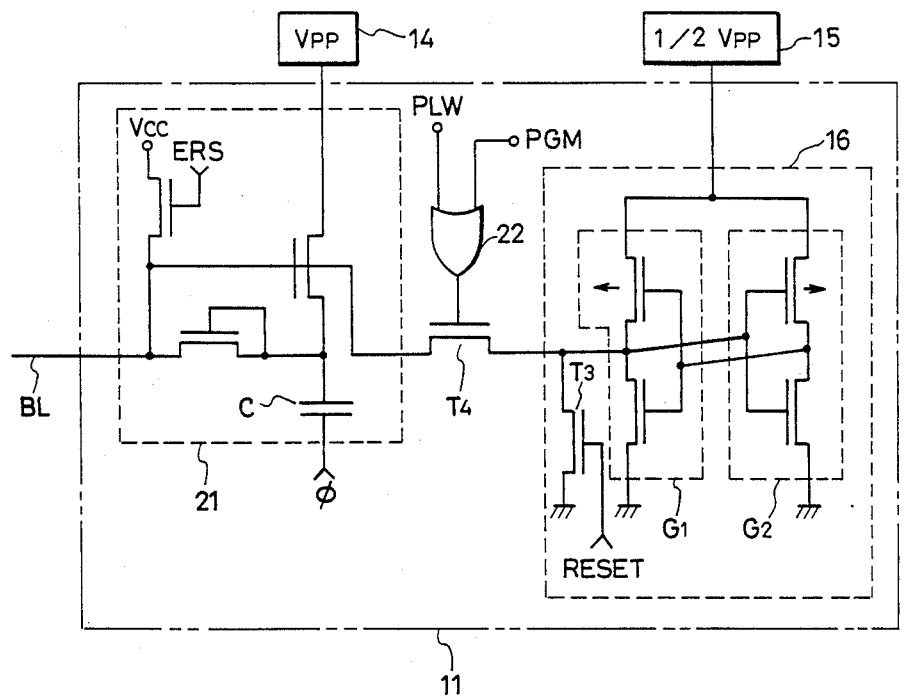
FIG. 12 is a schematic diagram showing in detail the portion corresponding to one bit line of a latch circuit 11 the embodiment shown in FIG. 11.

Referring to FIG. 11, the whole structure of the EEPROM in accordance with the second embodiment of the present invention will be described. The whole structure of the EEPROM of the second embodiment is approximately the same as the first embodiment shown in FIG. 5. What is different is that a signal ERS is newly applied to the latch circuit 11 from the writing control circuit 17.

The detailed structure of the portion corresponding to one bit line in the latch circuit 11 shown in FIG. 11 will be described with reference to FIG. 12. As is shown in the figure, the latch circuit 11 of the second embodiment comprises a latch 16, a bootstrap circuit 21, a gate transistor $T_4$ and an OR gate 22. The structure of the latch 16 is almost the same as that in the first embodiment shown in FIG. 7A. However, different from the latch 16 in FIG. 7A which receives the power supply voltage $V_{CC}$, the latch 16 of FIG. 12 receives an intermediate voltage $\frac{1}{2} V_{PP}$ from the $\frac{1}{2} V_{PP}$ generating circuit 15. Therefore, the latch 16 of FIG. 12 stores and holds either the intermediate voltage $\frac{1}{2} V_{PP}$ or the ground voltage 0 V. The gate transistor $T_4$ is provided between the latch and the bit line BL with the on.off thereof controlled by the signals BLW and PGM applied through the OR gate 22. The bootstrap circuit 21 comprises a capacitor C for boosting and carries out the boosting operation of the bit line BL based on the clock pulse $\phi$. The bootstrap circuit 21 is activated by a signal ERS applied from the writing control circuit 17 and boosts the voltage of the bit line BL approximately to the output voltage $V_{PP}$ of the $V_{PP}$ generating circuit 14 when activated.

The operation of the latch circuit 11 shown in FIG. 12 will be described in the following. In the page load cycle, the signal PLW becomes "H" level and the gate transistor $T_4$ becomes conductive. Therefore, the data introduced from the I/O line IOL to the bit line BL is stored and held in the latch 16. In the erasing cycle, both signals PLW and PGM are brought to "L" level and the gate transistor $G_4$ becomes non-conductive. Accordingly, the signal ERS is brought to "H" level and the bootstrap circuit 21 is activated. In this erasing cycle, the oscillating circuit 18 is enabled and a clock pulse $\phi$ is applied to the bootstrap circuit 21. Therefore, the bootstrap circuit 21 carries out the boosting operation to increase the voltage of the corresponding bit line BL to the high voltage $V_{PP}$. Next, in the writing cycle, the signal PGM is set at "H" level and the gate transistor $T_4$ becomes conductive. Therefore, the voltage held in the latch 16 is applied to the bit line BL through the gate transistor $T_4$. Namely, the voltage of the bit line BL is set at the ground voltage 0 V or the intermediate voltage $\frac{1}{2} V_{PP}$ in accordance with the voltage held in the latch 16.

As described above, in the second embodiment shown in FIGS. 10 to 12 the erasing and writing of each of the memory transistors are effected by the movement of charges by the electron tunneling. Therefore, it has the same effect as the above described first embodiment.

Although $\frac{1}{2} V_{PP}$ is employed as the intermediate voltage in the above described first and second embodiments, a value other than $\frac{1}{2} V_{PP}$ may be selected as the value of the intermediate voltage provided that the difference between the intermediate voltage and ground voltage and the difference between the intermediate voltage and the high voltage $V_{PP}$ are both insufficient to cause electron tunneling in each memory transistor.

Although one value is employed as the intermediate voltage in the above described first and second embodiments, two or more values may be used as the intermediate voltage. In the following, a third embodiment in which two values, that is, $\frac{1}{3} V_{PP}$ and $\frac{2}{3} V_{PP}$ are used as the intermediate voltage will be described with reference to FIGS. 13 and 14.

Figure 14:
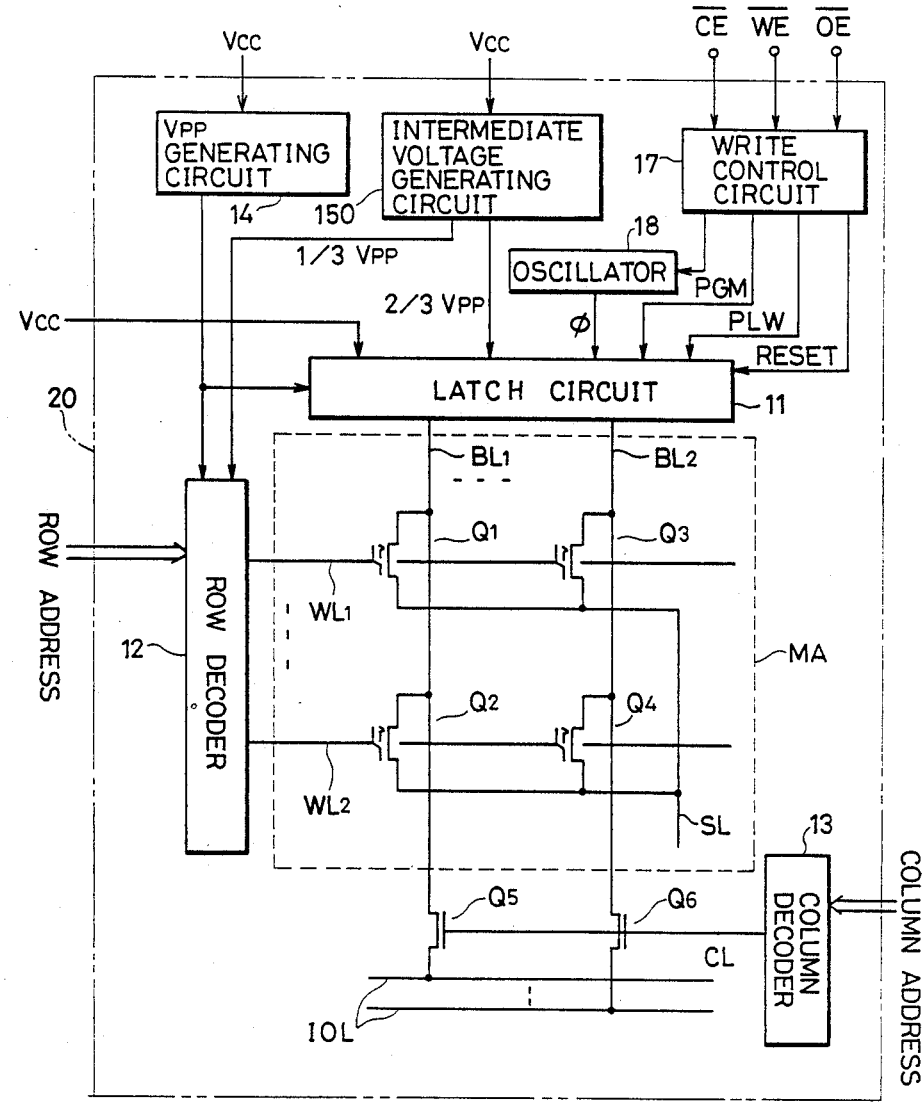
FIG. 14 is a block diagram showing the whole structure of the third embodiment of the present invention shown in FIG. 13.

First, as shown in FIG. 14, in the EEPROM of the third embodiment, an intermediate voltage generating circuit 150 is provided instead of the $\frac{1}{2} V_{PP}$ generating circuit 15 of FIG. 5. The intermediate voltage generating circuit 150 generates as the intermediate voltage, $\frac{1}{3} V_{PP}$ and $\frac{2}{3} V_{PP}$ to be applied to the row decoder 12 and the latch circuit 11, respectively. Other structures are the same as the embodiment shown in FIG. 5.

Figure 13:
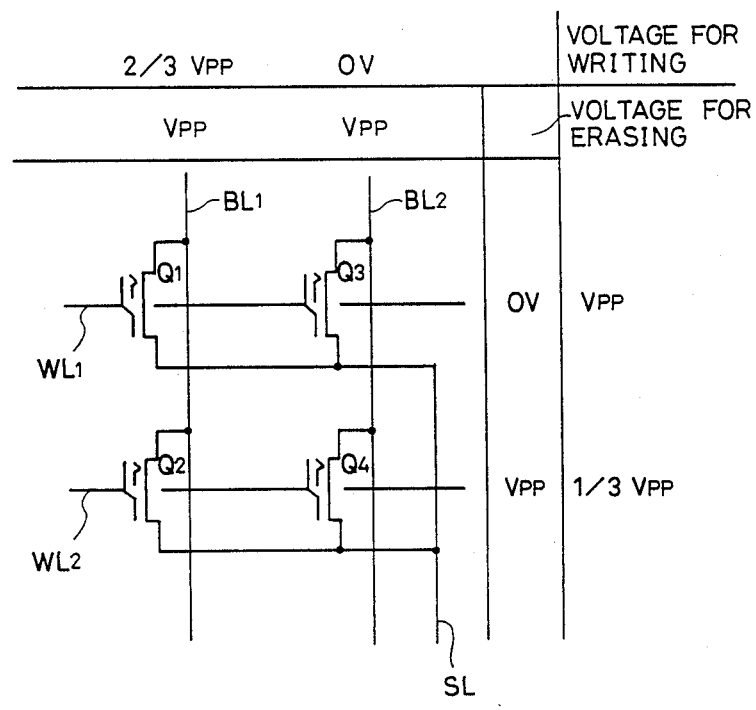
FIG. 13 shows voltages for writing and erasing applied to each of the memory transistors in a third embodiment of the present invention.

In the above structure, the voltages for writing and erasing are applied to each of the memory transistors in the memory cell array in the manner shown in FIG. 13. Namely, in the erasing cycle, the high voltage $V_{PP}$ is applied to all bit lines, 0 V is applied to the selected word line $WL_1$ and the high voltage $V_{PP}$ is applied to the non-selected word line $WL_2$. Consequently, electrons are discharged from the floating gates 5 to the drains 2 of the memory transistors Q1 and Q3 connected to the selected word line $WL_1$, and "1" is written in the memory transistors Q1 and Q3. In the writing cycle in which data is collectively written in the memory transistors connected to the selected word line, the high voltage $V_{PP}$ is applied to the selected word line $WL_1$ while an intermediate voltage $\frac{1}{3} V_{PP}$ is applied to the non-selected word line $WL_2$. The ground voltage 0 V is applied to the bit line $BL_2$ which is connected to the memory transistor to which "0" should be rewritten, and the intermediate voltage $\frac{2}{3} V_{PP}$ is applied to the other bit line $BL_1$. Consequently, a high electric field is generated only between the floating gate 5 and the drain 2 of the memory transistor Q3, and the electrons are discharged from the floating gate 5 to the drain 2 by electron tunneling. Therefore, the threshold voltage of the memory transistor Q3 is lowered to the negative level. "0" is written in the memory transistor Q3. The voltage difference between the drain and the control gate of each of the memory transistors is $\frac{1}{3} V_{PP}$, so that no electron tunneling occurs, and therefore the threshold voltage remains as it is. Therefore, "0" written in the erasing cycle is maintained.

As descrived above, also in the third embodiment shown in FIGS. 13 and 14, the writing and erasing of each of the memory transistor are all carried out by the movement of charges by the electron tunneling. Therefore, internal boosting circuit can be used as the high voltage source for writing and erasing, whereby the structure of the external power supply can be simplified.

Figure 2:
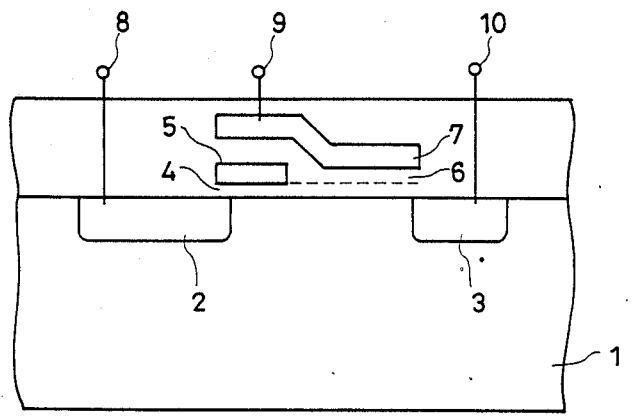
FIG. 2 shows a cross sectional structure of the memory transistor employed in the conventional nonvolatile semiconductor memory device shown in FIG. 1.

Although memory transistors having the structures shown in FIG. 4 is employed in the first to third embodiments, the structure shown in FIG. 2 or other structures may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising a memory cell array in which a plurality of word lines and a plurality of bit lines are arranged intersecting with each other, a memory cell being arranged at each of the intersections of the word lines and bit lines, each memory cell formed of one memory transistor having a floating gate, a word line connected to each control gate electrode of each of the memory transistors in the same row and a bit line connected to each drain electrode of each of the memory transistors in the same column, for storing information in each memory cell in a nonvolatile manner, said device comprising:

means for generating a high voltage selected to be higher than the ground voltage and sufficient to generate electron tunneling in said memory transistor;

means for generating at least one intermediate voltage selected to be higher than the ground voltage and lower than said high voltage, with at least one of the differences between the intermediate voltage and the ground voltage and between the intermediate voltage and said high voltage being insufficient to generate electron tunneling in said memory transistor;

latch means for storing data for at least one of said word lines to be written in said memory transistor; and data writing means for simultaneously writing data stored in said latch means in said plurality of memory transistors connected to a word line selected by an address signal, by applying the ground voltage, said high voltage and said intermediate voltage to said word line and said bit line such that the electron tunneling is generated only in the memory transistor specified by the externally inputted address signal and the stored content of said latch means in data writing.

2. A nonvolatile semiconductor memory device according to claim 1, wherein said means for generating the high voltage and said means for generating the intermediate voltage respectively comprise internal boosting circuits for boosting a single externally applied power supply voltage.

3. A nonvolatile semiconductor memory device according to claim 1, wherein said means for generating the intermediate voltage generates only one intermediate voltage which is approximately ½ of said high voltage.

4. A nonvolatile semiconductor memory device according to claim 1, wherein said means for generating the intermediate voltage generates a first intermediate voltage which is selected such that the difference between the first intermediate voltage and the ground voltage is insufficient to cause electron tunneling in said memory transistor, and a second intermediate voltage which is selected such that the difference between the second intermediate voltage and said high voltage and the difference between the second intermediate voltage and said first intermediate voltage are insufficient to generate electron tunneling in said memory transistor.

5. A nonvolatile semiconductor memory device according to claim 4, wherein said data writing means uses one of said first intermediate voltage and said second intermediate voltage as an intermediate voltage to be applied to said word line, and uses the other one of said first and second intermediate voltages as the intermediate voltage to be applied to said bit line.

6. A nonvolatile semiconductor memory device according to claim 1, wherein said latch means comprises a plurality of latch circuits provided for respective bit lines each capable of holding two different voltages, and said data writing means comprises a plurality of bootstrap circuits provided at each bit line, being activated or inactivated in response to the voltage held in the corresponding one of said latch circuit for introducing said high voltage when activated and said intermediate voltage when inactivated to the corresponding bit line.

7. A nonvolatile semiconductor memory device according to claim 1, wherein said latch means comprises a plurality of latch circuits provided for respective bit lines, each capable of holding two difference voltages, and said data writing means comprises a plurality of gate means provided for respective bit lines for applying directly the voltage held in the corresponding one of said latch circuits to said corresponding bit line.

8. A nonvolatile semiconductor memory device according to claim 1, which further comprises means for applying the ground voltage and said high voltage to said word line and said bit line such that electron tunneling is generated only in said memory transistor connected to said selected word line in data erasing, whereby information stored in said memory transistor is erased on a word line by word line basis.

9. A nonvolatile semiconductor memory device according to claim 1, which further comprises means for simultaneously erasing stored information in all memory transistors included in said memory cell array by applying, the ground voltage to one of said word lines and of said bit lines of each memory cell and applying said high voltage to the other one of said word lines and of said bit lines.

10. A method for writing data in a nonvolatile semiconductor memory device having a memory cell array in which a plurality of word lines and a plurality of bit lines are arranged crossing orthogonally with each other, a memory cell arranged at each of the intersections of the word lines and bit lines, each memory cell formed of one memory transistor having a floating gate, a word line connected to each control gate electrode of each of the memory transistors in the same row and a bit line being connected to each drain electrode of each of the memory transistors in the same column, comprising the steps of:

generating a high voltage selected to be higher than the ground voltage and sufficient to generate electron tunneling in said memory transistor;

generating at least one intermediate voltage selected to be higher than the ground voltage and lower than said high voltage with at least one of the differences between the intermediate voltage and the ground voltage and between the intermediate voltage and said high voltage being insufficient to generate electron tunneling in said memory transistor;

storing data to be written in said memory transistors for at least one of said word lines; and applying the ground voltage, said high voltage and said intermediate voltage to said word line and said bit line such that electron tunneling is generated only in the memory transistors specified by an externally inputted address signal and by said stored data to be written, whereby said stored data are simultaneously written in the memory transistors.

* * * * *